United States Patent
McKenna

[11] Patent Number: 6,007,654
[45] Date of Patent: Dec. 28, 1999

[54] NONCONTACT METHOD OF ADHERING A WAFER TO A WAFER TAPE

[75] Inventor: Robert G. McKenna, Houston, Tex.

[73] Assignee: Texas Instruments Incorporated, Dallas, Tex.

[21] Appl. No.: 08/993,100

[22] Filed: Dec. 18, 1997

Related U.S. Application Data

[60] Provisional application No. 60/034,831, Dec. 31, 1996.

[51] Int. Cl.[6] .................................................. B32B 31/00
[52] U.S. Cl. .......................... 156/156; 156/382; 156/285
[58] Field of Search .................................. 156/497, 382, 156/285, 156

[56] References Cited

U.S. PATENT DOCUMENTS

| | | | |
|---|---|---|---|
| 1,728,635 | 9/1929 | Snelling | 156/497 |
| 3,340,795 | 9/1967 | Hartley | 156/497 |
| 3,483,059 | 12/1969 | Dinter | 156/497 |

*Primary Examiner*—Francis J. Lorin
*Attorney, Agent, or Firm*—Charles A. Brill; Frederick J. Telecky, Jr.; Richard L. Donaldson

[57] ABSTRACT

A method and apparatus (10) for securing a fragile wafer (14) to a wafer tape (51) secured taut across a wafer frame (50). A controlled jet of gas (46) is directed by a nozzle (45) against the backside of the wafer tape (51) to securely adhere the wafer tape (51) to the backside of the wafer (14). Preferably, a spiral pattern (70) of air is directed by the nozzle (45) to secure the wafer tape (51) to the wafer (14) without forming air bubbles or creases between the wafer tape and wafer. Such a method and apparatus is especially suitable for securely adhering fragile wafers to wafer tape that are subsequently broken along kerfs and which wafers are inverted to allow particles to drop downwardly.

14 Claims, 2 Drawing Sheets

FIG. 2
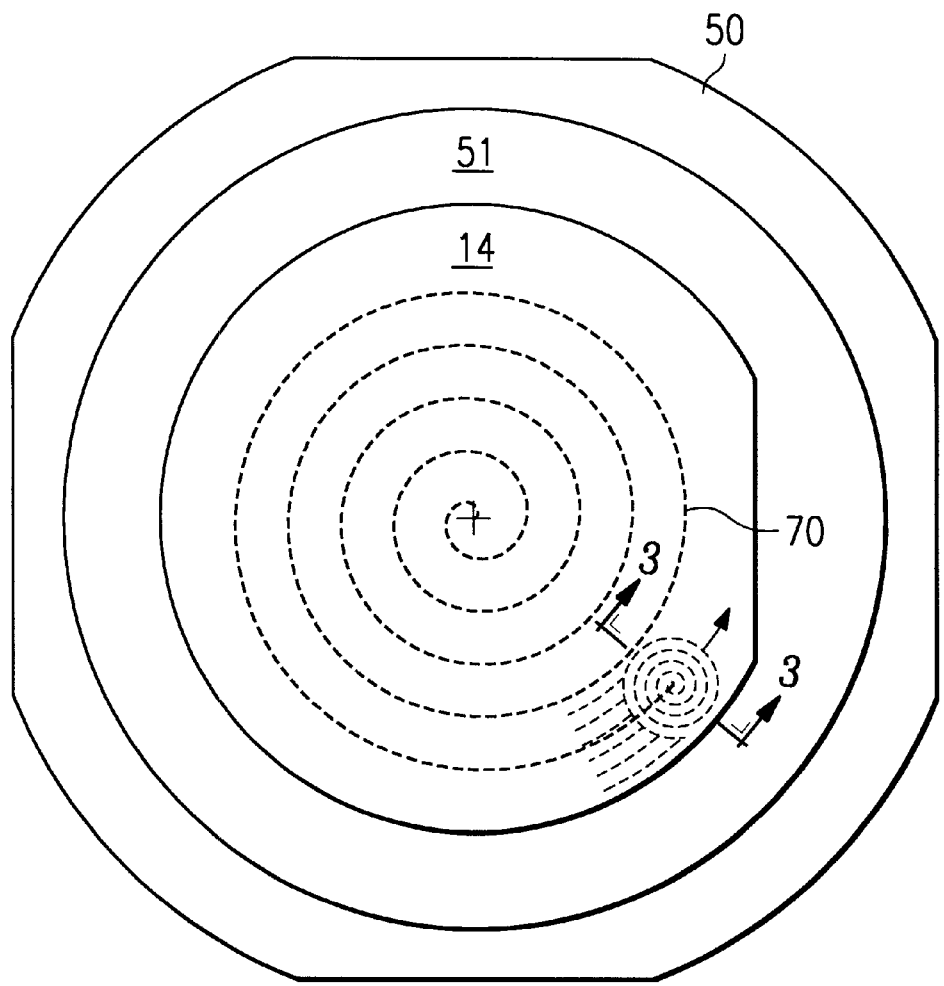
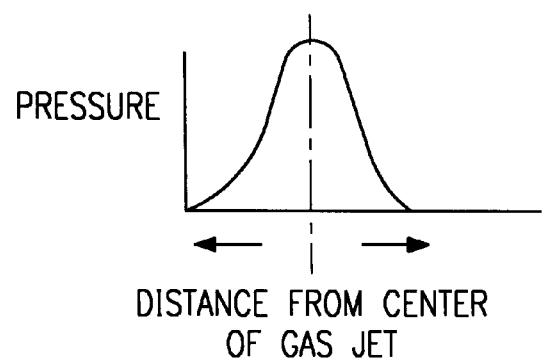
DISTANCE FROM CENTER
OF GAS JET
FIG. 3

NONCONTACT METHOD OF ADHERING A WAFER TO A WAFER TAPE

CROSS REFERENCE TO RELATED APPLICATIONS

This application claims benefit of Provisional Application Ser. No. 60/034,831, filed Dec. 31, 1996.

Cross reference is made to the following co-pending patent applications, each being assigned to the same assignee as the present invention and the teachings included herein by reference:

| Ser. No. | TITLE | FILING DATE |
| --- | --- | --- |
| 08/974772 | UV EXPOSURE OF STRETCHED UV TAPE ON WAFER FRAMES TO ELIMINATE PREMATURE TAPE DELAMINATION FROM THE FRAME | 11-26-96 |
| 08/975029 | METHOD AND APPARATUS FOR STRETCHING SAW FILM TAPE AFTER BREAKING A PARTIALLY SAWN WAFER | 11-26-96 |
| 08/975378 | METHOD AND APPARATUS FOR BREAKING AND SEPARATING DIE FROM A WAFER USING A MULTI-RADII DOME | 11-26-96 |

FIELD OF THE INVENTION

The present invention is generally related to the handling of semiconductor wafers, and more particularly to a method for securely adhering fragile wafers to a wafer tape including wafers that are already partially sawn.

BACKGROUND OF THE INVENTION

In the manufacture of semiconductor devices, it is conventional to form many integrated circuits or devices upon a single wafer of material, such as silicon. After the devices have been formed on the wafer, it is necessary to separate each device from one another such as by completely cutting the wafer into segments on which one or more devices or circuits have been formed, these segments commonly being referred to as die. For conventional integrated circuits, the completed wafer is protected with an overcoat of material, such as silicon dioxide. The completed wafer can then be securely adhered to an adhesive wafer tape stretched across a circular wafer frame, whereby the active wafer surface can be physically supported by a surface. Rollers or wheels may be rolled across the backside of the tape proximate the supported wafer to secure the tape to the wafer. The protective overcoat protects the active devices from damage during the physical application of force. The wafer can be completely sawn along the streets separating the individual circuits to form the die. The die remain securely adhered to the wafer tape, and are later removed by pick and place equipment for die packaging.

For devices that are unsuitable for a complete saw process and can not have the active surface physically supported due to handling constraints, a partial saw process may be performed. Such devices that are unsuitable for a complete saw process are micromechanical devices having moving parts including the digital micromirror device (DMD) manufactured by Texas Instruments of Dallas, Tex. Orthogonal lines may be scribed on the wafer, or a partial saw can be formed along the wafer streets extending between devices, the formed saw lines commonly being known as kerfs. A domed wafer is pressed against the wafer backside to break the wafer along these wafer kerfs to form individual die. One such method is taught in commonly assigned patent Ser. No. 08/975,378 entitled "Method and Apparatus for Breaking and Separating Die from a Wafer using a Multi-Radii Dome", and Ser. No. 08/975,029, entitled "Method and Apparatus for Stretching Saw Film Tape after Breaking a Partially Sawn Wafer", the teachings of which are incorporated herein by reference. If care is not taken during the breaking of the wafer, the individual die may be partially fractured or broken.

As illustrated in these cross referenced patent applications, the wafer break process is facilitated by placing the fabricated wafer upon a stretchable membrane such as wafer tape having an adhesive on one side. As the wafer is broken with an anvil, the tape is stretched to further separate the formed die from one another to avoid the die corners from rubbing against one another. After the wafer break process, pick and place equipment removes the individual die from the tape. These die are then packaged with leads and pins, the packaging comprising plastic, ceramic or other suitable material. Sometimes, the die are hermetically sealed in the package to prevent moisture from damaging the device, particularly if the device is a micromechanical device having moving parts.

It is important that the fabricated wafer is securely placed upon the stretchable membrane to achieve an effective wafer break, especially if the wafer is inverted during wafer break. It is preferred to invert the wafer during the wafer break such that any particles generated during the break fall downwardly and away from the fragile micromechanical devices. If the wafer is not sufficiently secured to the tape, the individual die may fall off the tape and be scraped. Any air bubbles need to be removed from between the tape and wafer to avoid die shifting and engaging one another.

It is desired to provide an improved method and apparatus for securely adhering fragile semiconductor wafers to a wafer tape, particularly partially sawn wafers that are to be broken along kerfs to form individual die. It is especially desired to provide an improved method for adhering fragile wafers to an adhesive wafer tape that have fragile active surfaces which can not be physically pressed upon a support surface while securing the wafer to the tape. The fragile wafer needs to be securely adhered to the wafer such that it can be inverted, allowing particles generated during wafer break to fall downwardly without risk of the die inadvertently releasing from the wafer tape.

SUMMARY OF THE INVENTION

The present invention achieves technical advantages as a noncontact method and apparatus which directs a jet of compressed air or gas to the backside of a wafer tape proximate a supported wafer, thereby securely adhering the adhesive side of the tape to the wafer. The jet of compressed air or gas is selectively applied to the wafer tape as it is supported taut across a saw frame with sufficient pressure to cause the sticky saw film to adhere to the back of a fragile semiconductor wafer, without causing it to break. Application of concentrated gas is a noncontact method which eliminates the necessity for physically handling or supporting the active surface of the wafer, such as a wafer having micromechanical devices. The present invention is especially suitable for mounting fragile wafers that are partially sawn and which are eventually separated by pressing an anvil against the back side of an inverted wafer.

According to the preferred method of the present invention, a concentrated stream or jet of gas is first directed upon and focused against the wafer tape proximate the center of the supported wafer. The jet of gas is then directed outwardly while the wafer and wafer tape is rotated below it, therefore defining a spiral or helix pattern to securely adhere the wafer tape to the wafer without introducing air bubbles between the wafer tape and wafer. The width of the jet of gas is sufficient to sweep a spiral path that overlaps the previous path. Preferably, there is a 20%–50% overlap of the spiral path to ensure any gas between the tape and wafer is directed radially outward and does not become entrapped between the tape and wafer. A suitable nozzle size and gas pressure is selected such that the wafer does not break as the gas forces the tape against the wafer bottom.

BRIEF DESCRIPTION OF THE DRAWINGS

FIG. 2 is an illustration of the spiral path that the concentrated gas is applied from the center of the wafer outward with overlap to achieve a secure adhesion of the wafer tape to the wafer; and FIG. 3 is a plot of the gas pressure profile as applied to the wafer tape.

DESCRIPTION OF THE PREFERRED EMBODIMENT

Figure 1:
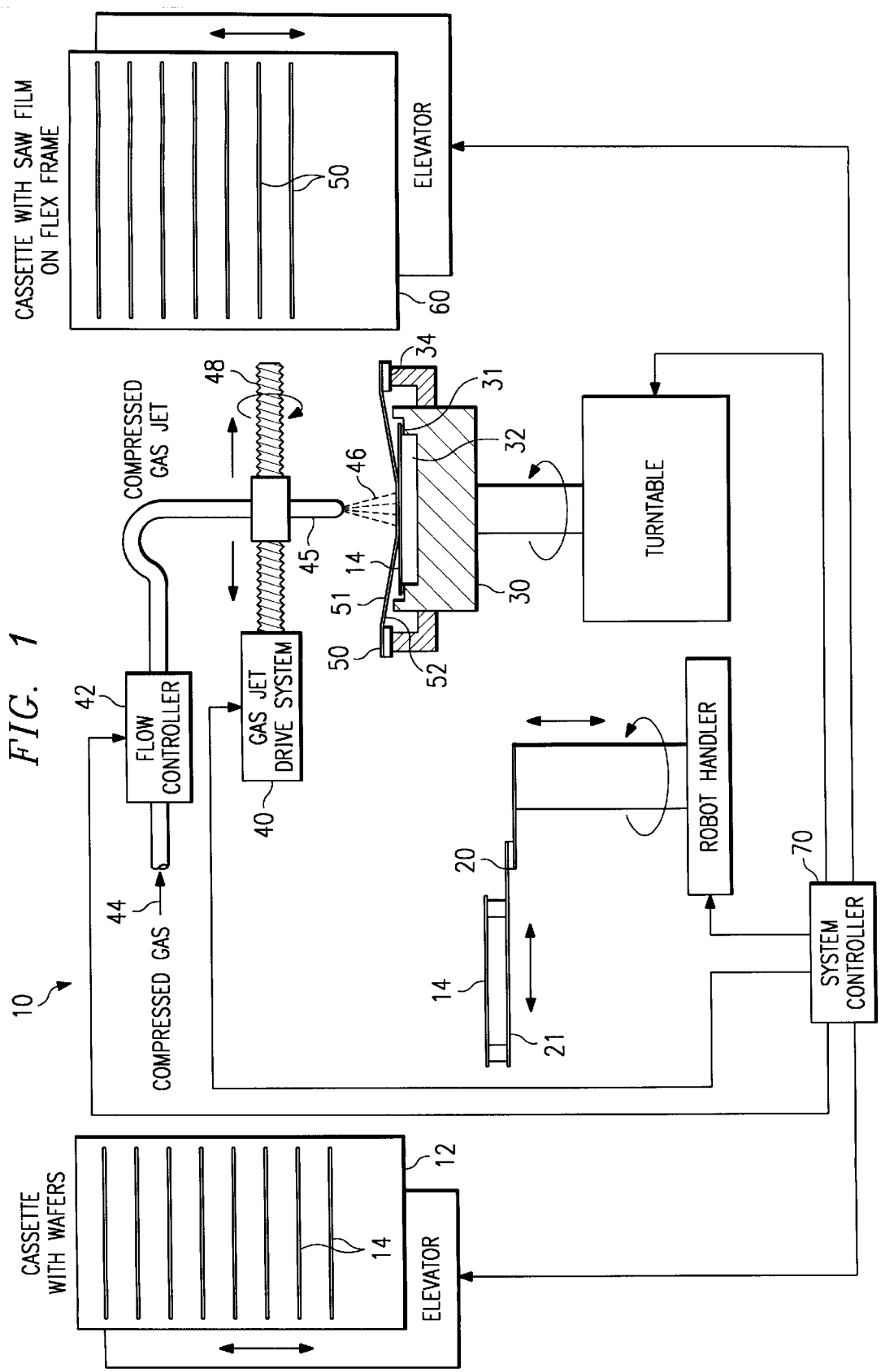
FIG. 1 is an elevation view of the apparatus of the present invention suited to direct concentrated gas in a spiral path against a wafer tape supporting a wafer across a wafer frame.

Referring now to FIG. 1, there is generally shown at 10 an apparatus according to the preferred embodiment of the present invention. Apparatus 10 is seen to comprise a cassette 12 for holding a series of completely fabricated wafers 14, which may be partially sawn defining kerfs, to be processed. Completed wafers 14 are individually unloaded or dispensed from cassette 12 by a robot arm 20 in a conventional manner. A wafer pick up device 21 on robot arm 20 places the dispensed wafer 14 onto a turntable 30, where the wafer 14 is held in place at its rim on turntable 30 by a vacuum applied to a vacuum grove 31 defined around the upper rim of turntable 30. The wafer 14 is inverted and supported over a turntable cavity 32 with the active portion of the wafer 14 facing down toward the cavity 32. The robot arm 20 then selects a circular wafer frame 50 having a wafer tape 51 supported taut thereacross from cassette carrier 60, and places the frame onto an annular support rim 34 extending upwardly from turntable 30. The adhesive side 52 of tape 51 is positioned over and faces downward towards the non-active backside of wafer 14. Support rim 34 is elevationally positioned to orient the adhesive side 52 of wafer tape 51 approximately 0.005 to 0.020 inches above the backside of the underlying wafer 14, although this preferred distance is not intended to be limited to this range.

According to the preferred embodiment of the present invention, apparatus 10 is seen to include a source of directed compressed gas 44 feeding gas to a downwardly extending nozzle 45 positioned under turntable 30. Nozzle 45 is adapted to direct a concentrated stream of compressed air or gas 46 downwardly against the backside of wafer tape 51, as shown. The position of nozzle 45 and thus the location from where the gas flows is controlled by a gas jet drive system 40. Drive system 40 selectively, linearly, positions nozzle 45 along a rod 48 so that gas from nozzle 45 is directed first at the center of the wafer and then toward the outside of the wafer, while turntable 30 rotates the wafer 14 and wafer frame 50 under the nozzle 45, causing the gas pressure to inscribe a radially expanding spiral pattern of gas pressure on the backside of the wafer tape 51, as shown in FIG. 2.

By selectively directing the concentrated gas 46 against the back of the wafer tape 51 proximate supported wafer 14, an adhesive side 52 of wafer tape 51 is securely pressed against the backside of wafer tape 14. The impinging gas jet 46 has sufficient force to securely adhere the wafer tape 51 to the closely proximate wafer 14, but which force is not sufficient to break the fragile wafer along the saw kerfs (not shown) formed in the partially sawn wafer 14. The range of gas pressure for stream 46 is set by a flow controller 42 and varies, but is preferably in the range of 5 psi to 25 psi. The width and crossection of the gas jet 46 where it impinges tape 51 is dictated by the diameter of nozzle 45 and the selected gas pressure, and is preferably circular having a diameter of about 0.5 inches, although limitation to this dimension and crossection is not to be inferred. the gas jet 46 may also be heated with a heat source (not shown) within jet 45 to increase the adhesion of the tape 51 to the wafer 14. A system controller 70 controls the various components 12, 20, 30, 40, 42 and 60, including positioning and timing.

Referring to FIG. 2, there is illustrated the spiral path of compressed gas that is caused against tape 51 as nozzle 45 directs gas stream 46 in a linear path along rod 48 as wafer 14 and wafer frame 50 are rotated with respect to air jet 46. The gas stream 46 is first directed against the center of the wafer tape 51 proximate the center of the supported wafer 14. Nozzle 45 is then positioned by gas jet drive 40 to move in the X direction along rod 48, while turntable 30 rotates the wafer 14 and wafer frame 50 proximate the air stream 46, causing a spiral or helix pattern to be inscribed at the tape 51 from the center outward, as shown in 70. The path 70 that the gas impinges wafer tape 51 is shown to overlap the previous path to ensure any air bubbles between the tape 51 and wafer 14 are directed and forced radially outward and do not become entrapped between the wafer tape 51 and wafer 14. The nozzle 45 is designed, in combination with the impinging gas pressure controlled by controller 42 to form a gas pressure profile as shown in section 3—3 of FIG. 2, and plotted in FIG. 3. The gas pressure is highest at the center, and falls off to either side, approximating a gausian curve. The width of the pressure curve is designed to provide for a 20% to 50% overlap of the path as the nozzle 45 moves the gas jet outwardly across the backside of the wafer 14, as shown by the hyphenated lines.

It is necessary that air bubbles are not present or the wafer may not properly break or separate along the saw kerfs, which could inhibit the subsequent pick and place of the individual die from the wafer tape for packaging. While a spiral path is preferred, it is contemplated that other patterns can be utilized to securely adhere the tape to the wafer. For instance, sequentially directing air against the wafer in horizontal lines, left-to-right, with overlap from line-to-line. A spiral method is preferred since a continuous path can be easily provided, and any air entrapped between the wafer and tape is radially pushed outward toward the perimeter of the wafer along a long line. If the air pressure is applied left-to-right, similar to a raster-scan technique for displays, any entrapped air would be forced downwardly toward the bottom of the wafer which will tend to accumulate along a shorter line. The accumulated air may tend to creep back towards a previously scanned area of the tape, and thus a larger overlap of the paths would be required.

In summary, the present invention utilizes compressed gas or air to adhere a wafer tape to a fragile wafer, which air pressure is sufficient to achieve secured adhesion without causing the wafer to break. Further, the method applies a force without physically contacting the wafer or the wafer active surface. That is, the face of the wafer does not need to be supported as force is applied against the backside of the wafer with gas or air. This is especially suitable for processing fragile wafers that have micromechanical active surfaces, such as a DMD. The apparatus is rather simple and cost effective for securely adhering a wafer to a wafer tape in preparation for a wafer break process.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. An apparatus for processing a wafer, comprising:
   a) a flexible membrane having an adhesive first surface and an opposing second surface;
   b) a frame supporting said flexible membrane;
   c) support means to support the wafer closely proximate said flexible membrane adhesive first surface; and
   d) gas generating means for directing gas against said membrane second surface to increase adhesion of said membrane to said wafer, said gas generating means comprises gas directing means for directing said gas stream from proximate center of said wafer outwardly.

2. The apparatus as specified in claim 1 wherein said gas generating means directs said gas in a concentrated stream to concentrate a force upon said membrane second surface.

3. The apparatus as specified in claim 1 wherein said gas directing means directs said gas stream in a continuous spiral path outwardly from said center of said wafer.

4. The apparatus as specified in claim 3 wherein said spiral path has a width such that the path overlaps along adjacent rings.

5. The apparatus as specified in claim 1 further comprising means to heat said gas.

6. The apparatus as specified in claim 1 wherein said gas directing means comprises means to rotate said frame and means to linearly advance said gas generating means from above a center of said wafer outwardly.

7. The apparatus as specified in claim 1 wherein said support means is positioned under said frame and said membrane adhesive surface faces downwardly toward the wafer supported by said support means.

8. A method of securing a wafer to a flexible adhesive membrane having an adhesive first surface and an opposing second surface, comprising the steps of:
   a) placing a wafer proximate said adhesive first surface; and
   b) directing a gas jet against said membrane second surface proximate said wafer to increase adhesion of said membrane adhesive first surface to said wafer, wherein said gas is directed from proximate a center of said wafer outwardly.

9. The method as specified in claim 8 wherein said gas is directed in a spiral path.

10. The method as specified in claim 9 wherein said spiral path has a width such that said path overlaps itself.

11. The method as specified in claim 8 wherein said gas is heated.

12. The method as specified in claim 8 wherein said gas is concentrated into a stream as it is directed against said membrane.

13. The method as specified in claim 8 wherein said wafer is inverted and positioned below said membrane adhesive first surface, and said gas is directed from above against said membrane second surface.

14. The method as specified in claim 9 comprising the step of rotating said wafer and said membrane as said gas jet is linearly advanced from a center of said membrane outwardly to define said spiral path.

* * * * *